United States Patent [19]

Oughton, Jr. et al.

[11] 4,251,683
[45] Feb. 17, 1981

[54] INTERCONNECT TAIL FOR A MEMBRANE SWITCH

[75] Inventors: Ray L. Oughton, Jr., Woodstock; Willis A. Larson, Crystal Lake, both of Ill.

[73] Assignee: Oak Industries, Inc., Crystal Lake, Ill.

[21] Appl. No.: 32,115

[22] Filed: Apr. 23, 1979

[51] Int. Cl.³ .............................................. H01R 9/09
[52] U.S. Cl. ............................. 174/74 R; 174/117 FF
[58] Field of Search ...... 174/117 F, 117 FF, 117 PC, 174/68.5, 74 R; 339/278 C

[56] References Cited

U.S. PATENT DOCUMENTS

| 3,239,916 | 3/1966 | Love | 174/117 FF X |
| 3,391,246 | 7/1968 | Freeman et al. | 174/117 FF X |

Primary Examiner—Roy N. Envall, Jr.
Attorney, Agent, or Firm—Kinzer, Plyer, Dorn & McEachran

[57] ABSTRACT

A connecting tail for a switching device, for example a membrane switch, includes a substrate having a plurality of spaced parallel silver conductors formed thereon. To prevent migration of silver between the spaced conductors there are a plurality of parallel notches, one between adjacent silver conductors. At least a portion of the conductors are covered by an adhesive, with the notches extending into the adhesive.

11 Claims, 5 Drawing Figures

U.S. Patent  Feb. 17, 1981  4,251,683
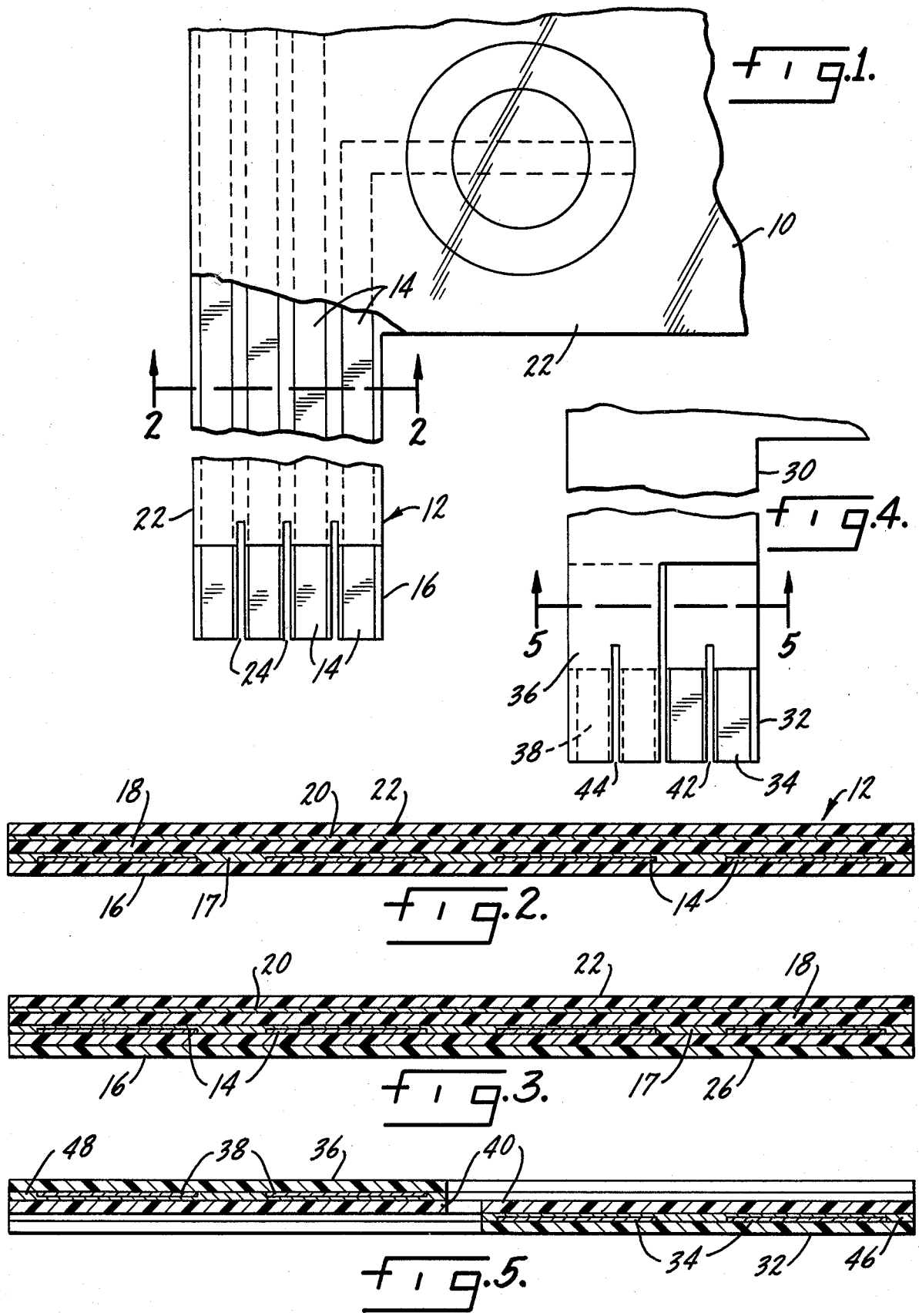

INTERCONNECT TAIL FOR A MEMBRANE SWITCH

SUMMARY OF THE INVENTION

The present invention relates to membrane switches and in particular to connecting tails for such switches and more specifically to a means for preventing migration of silver between conductors on the connecting tails.

One purpose is a connecting tail of the type described in which parallel silver conductors are separated by slits or notches which extend through the underlying substrate and through an adhesive layer partially covering the silver conductors.

Another purpose is a connecting tail of the type described which may include a polyester backing strip to provide added stiffness.

Another purpose is a membrane switch of the type described in which adjacent silver conductors are separated by notches, which notches extend into the adhesive and spacer forming a portion of a connecting tail.

Another purpose is a membrane switch of the type described in which the connecting tail includes a pair of spaced substrates, each having silver conductors formed thereon, and a spacer for separating the substrates.

Another purpose is a connecting tail of the type described in which there are separate spaced substrates, formed into a single unit by the spacer, with the conductors of one substrate having an electrical polarity opposite that of the conductors on the other substrate.

Other purposes will appear in the ensuing specification, drawings and claims.

BRIEF DESCRIPTION OF THE DRAWINGS

The invention is illustrated diagrammatically in the following drawings wherein:

FIG. 1 is a top plan view of a portion of a membrane switch and its connecting tail, with portions removed for clarity, FIG. 2 is an enlarged section along plane 2—2 of FIG. 1, FIG. 3 is an enlarged section, similar to FIG. 2, but showing a modified form of connecting tail, FIG. 4 is a top plan view, similar to FIG. 1, but illustrating a further form of connecting tail, and FIG. 5 is an enlarged section along plane 5—5 of FIG. 4.

DESCRIPTION OF THE PREFERRED EMBODIMENT

The present invention concerns membrane switches of the type generally shown in U.S. Pat. Nos. 3,988,551 and 4,017,687, as well as a number of similar patents relating to the same subject matter. More specifically, the present invention relates to the connecting tail for use with such a switch. By connecting tail we refer to that portion of the switch which connects to the auxiliary electrical circuitry and conventionally will extend outwardly from one side or one area of a membrane switch or other type of switch device. The present invention is not limited to use with membrane switches, although connecting tails of the type disclosed herein find ready application in such an environment.

Electrical conductors which are formed of silver and which may be painted, printed or silk screened onto one or more adjacent surfaces are an economical means for forming not only a membrane switch, but also the described connecting tail. Because of its high electrical conductivity, silver is a very desirable conductive metal which may be painted, printed or silk screened onto a surface. Other metals of the non-noble type either do not normally remain conductive after they have been painted on a supporting surface, or are poor conductors. Silver, on the other hand, remains conductive but has the serious drawback that the silver particles tend to migrate from the anode to the cathode and ultimately a high impedance short may be formed between normally separate conductors or elements. The present invention is particularly directed to a means for impeding the formation of such a high impedance short to the point where what silver migration does take place does not affect the useful life of the switch.

The phenomenon of silver migration has long been known and has been extensively documented in numerous publications over the last 30 years. Essentially, migration takes place when there is a potential difference between spaced silver conductors and there is sufficient humidity, normally a continuous moisture film, to permit the metal silver to be ionized to positive silver ions. Normally, the following chemical reaction takes place:

$$2AG^+ + 2OH^- \rightarrow 2AG(OH) \rightarrow AG_2O + H_2O$$

In essence, the metallic silver is changed to a silver hydroxide which is soluble in water. The silver then deposits in the vicinity of the cathode due to the voltage potential. The migration is from the anode to the cathode, but the dendrites that are formed grow from the cathode toward the anode. In the case of an alternating potential, the dendrites will be formed from both conductors toward each other.

The growth of the dendrites in silver migration can be extremely rapid under conditions of sufficiently high applied voltage in substantial humidity. At times only a few minutes or even seconds are necessary to complete a short between two spaced conductors, where the spacing is small.

In a connecting tail it is normally not possible to seal the silver conductor areas to prevent moisture. However, it is possible, by careful construction of the tail, to provide sufficient separation between conductors, in the nature of a space, so as to impede silver migration to the point where it is not a problem. In like manner, since migration is the result of adjacent conductors having opposite polarities, in one form of the present invention only conductors of like polarity are arranged on the same portion of the substrate tail.

In the construction of FIGS. 1 and 2, a membrane switch is indicated generally at 10 and a connecting tail 12 extends outwardly from one side thereof. The membrane switch may be of many different constructions. Conventionally, such a switch includes a substrate and a flexible membrane, with the membrane being movable toward the substrate so as to make physical and electrical contact between normally spaced conductors carried on their respective surfaces. A spacer, having openings therein, separates the membrane and substrate and the membrane is moved through the spacer openings to perform the described switching action. The spacer may be attached to both the substrate and membrane by adhesive or by other means. The conductors on the membrane and substrate may be silver, or they may be of other metals. The present invention is more particularly concerned with the tail.

Connecting tail 12 has a plurality of generally parallel silver conductors 14 which may be silk screened or painted in some other manner upon an underlying substrate 16. Substrate 16 may be integral with the substrate of switch 10 or it may be separate. Conductors 14 extend throughout the length of the tail and, as indicated in dotted lines, extend upon the substrate of switch 10 where they may be either integral with or electrically connected to the conductors on the substrate of switch 10. There may be a similar tail for the membrane, or, as shown hereinafter, the tails for the membrane and substrate may be combined.

As illustrated particularly in the enlargement of FIG. 2, a spacer 18 is secured by adhesive 17 to substrate 16 and in turn will be adhesively secured, by an adhesive layer 20, to a cover 22 which may be integral with or separate from the membrane of switch 10. In essence, the tail consists of a top and bottom layer, a spacer 18, and silver conductors on either the top of bottom layer, with the entire assembly being held together by a suitable adhesive. The cover, spacer and adhesive are removed from the outward portion of the tail, as particularly illustrated in FIG. 1, so that the conductors are exposed when the tail is inserted into associated electrical equipment.

The invention should not be limited to a tail as described above. The tail may consist of (1) either a bottom layer or a top layer and conductors or (2) adhesively secured top and bottom layers and conductors, or (3) the above-described unit which includes a spacer.

In order to separate the conductors, one from another, there is a notch 24 positioned between adjacent conductors, which notches extend into the adhesive and the remaining layers of the tail. The conductors are physically separated, one from another, and any path of silver migration between conductors must pass through all portions of the tail including the insulating resinous adhesive which has an extremely high resistance to such silver migration, in the order of 30,000 meg ohms. Thus, the combination of the described notches, which extend into the tail layers and adhesive, and the high resistance of the adhesive effectively impedes migration between adjacent silver conductors.

As a typical example, the silver conductors may be 0.07 inch wide with 0.03 inch spacing. A 0.015 inch notch or slit may be cut halfway between the silver conductors with each notch extending a distance of 0.250 inch from the outward end of the tail. The adhesive and the spacer may extend to approximately 0.200 inch from the end of the tail.

FIG. 3 provides a modification of the construction of FIGS. 1 and 2 with the addition of a backing strip 26 attached to substrate 16. The backing strip may be of a polyester material and may be adhesively attached, normally prior to the forming notches 24. The described notches will extend through the backing strip as well as through the substrate. The backing strip provides added stiffness for the tail making it easier to insert into a mating connector.

FIGS. 4 and 5 illustrate a further modification of the invention and are specifically directed to a tail in which conductors from both membrane and substrate are combined into a single integral unit. As indicated above, silver migration is a function of the voltage potential between adjacent conductors. Thus, in the construction of FIGS. 4 and 5, the conductors on each tail portion are of like polarity.

Looking specifically at FIG. 4, tail 30 has a substrate 32 with a plurality of silver conductors 34 formed thereon. A second substrate 36 has silver conductors 38 formed thereon, such conductors being shown in dotted lines. The tails may be constructed as described above. Substrates 32 and 36 do not overlap, but are positioned side by side and separated. There are notches 42 and 44, respectively, in the substrates 32 and 36 or such notches may be eliminated. Adhesive layers 46 and 48, which secure the substrates to spacer 40, extend beyond the termination of the notches, as was true in the structure of FIGS. 1–3. Thus, the adhesive will, in cooperation with the notches, prevent migration between adjacent conductors on the same substrate, even though they be of like polarity, specifically for those instances in which the voltage potentials are not the same.

The structure of FIGS. 4 and 5 in essence impedes or retards silver migration by substantially eliminating potential differences between adjacent conductors and in addition may retard migration by the use of notches and an adhesive overlay as in the construction of FIGS. 1–3.

Whereas the preferred form of the invention has been shown and described herein, it should be realized that there may be many modifications, substitutions and alterations thereto.

The embodiments of the invention in which an exclusive property or privileged is claimed are defined as follows:

1. A connecting tail for a switching device, said tail including a substrate having a plurality of spaced parallel silver conductors formed thereon, a portion of each silver conductor being covered by an insulating resin while another portion of each silver conductor is exposed, and means for preventing silver migration between adjacent conductors including a plurality of parallel notches, one between adjacent silver conductors, said notches extending throughout the extent of the exposed portion of the conductors and into the area of said insulating resin.

2. The connecting tail of claim 1 further characterized by and including a backing strip attached to said substrate on the opposite side from said silver conductors.

3. A membrane switch having a substrate with a plurality of conductive elements formed thereon, a connecting tail extending outwardly from said substrate and having formed thereon a plurality of spaced silver conductors, in circuit with said conductive elements, a portion of said conductors being exposed, and a plurality of notches, one between adjacent silver conductors, said notches extending throughout the extent of the exposed portion of the conductors to prevent migration of silver therebetween.

4. The membrane switch of claim 3 further characterized in that a portion of said silver conductors, adjacent said substrate, is covered by insulating resin, said notches extending into said insulating resin.

5. The membrane switch of claim 3 further characterized by and including a backing strip attached to said connecting tail on the side opposite said silver conductors.

6. The membrane switch of claim 5 further characterized in that said backing strip is formed of a polyester material adhesively attached to said tail, with said notches extending through said backing strip.

7. A connecting tail for a switch device including substrate means having a plurality of silver conductors formed thereon, a portion of said conductors being exposed, and means for preventing migration of silver between conductors including means for separating said conductors at the exposed portion thereof.

8. The connecting tail of claim 7 further characterized in that said silver conductors are arranged side by side on said substrate means, with said separating means including a plurality of notches, there being a notch between adjacent silver conductors.

9. The connecting tail of claim 7 further characterized in that said substrate means includes spaced and parallel substrates, each having spaced silver conductors formed thereon.

10. The connecting tail of claim 9 further characterized in that said spacer is adhesively secured to said substrates.

11. The connecting tail of claim 10 further characterized in that said silver conductors are in facing relationship with each other.

* * * * *